United States Patent [19]

Ametani et al.

[11] Patent Number: 5,009,735
[45] Date of Patent: Apr. 23, 1991

[54] PROCESS FOR PEELING PROTECTIVE FILM OFF A WAFER

[75] Inventors: Minoru Ametani; Keigo Funakoshi; Akihiko Kira; Takao Matsushita; Keizo Shirakura, all of Osaka, Japan

[73] Assignee: Nitto Denko Corporation, Osaka, Japan

[21] Appl. No.: 276,587

[22] Filed: Nov. 28, 1988

[30] Foreign Application Priority Data

Nov. 28, 1987 [JP] Japan ................................ 62-300621
Nov. 10, 1988 [JP] Japan ................................ 63-285480

[51] Int. Cl.$^5$ ............................................. B32B 31/18
[52] U.S. Cl. .................................... 156/241; 156/249; 156/344; 156/584
[58] Field of Search ............... 156/584, 349, 230, 247, 156/248, 249, 241, 238, 289, 583.91, 302; 226/94, 96

[56] References Cited

U.S. PATENT DOCUMENTS 4,285,759 8/1981 Allen et al. ............................ 226/96
4,631,103 12/1986 Ametani ................................ 156/344
4,732,642 3/1988 Ametani ................................ 156/344
4,770,737 9/1988 Seki ........................................ 156/584

FOREIGN PATENT DOCUMENTS 2128580 5/1984 United Kingdom .
2157193 10/1985 United Kingdom .

Primary Examiner—Michael W. Ball
Assistant Examiner—Louis Falasco
Attorney, Agent, or Firm—Sughrue, Mion, Zinn, Macpeak & Seas

[57] ABSTRACT

A process for peeling a protective film stuck to an upper side of a wafer is disclosed. The protective film is peeled by adhering an adhesive tape to the upper side of the rear end of said protective film stuck on the wafer by means of a press roller, lifting the press roller and sliding said press roller forward, sliding a peeling unit forward to peel the adhesive tape together with the protective film by utilizing the adhesive force of the adhesive tape. The wafer is prevented from being damaged.

7 Claims, 4 Drawing Sheets

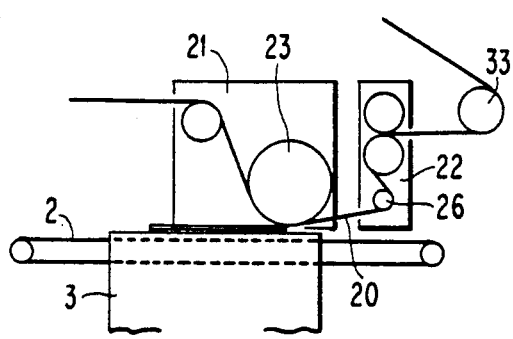
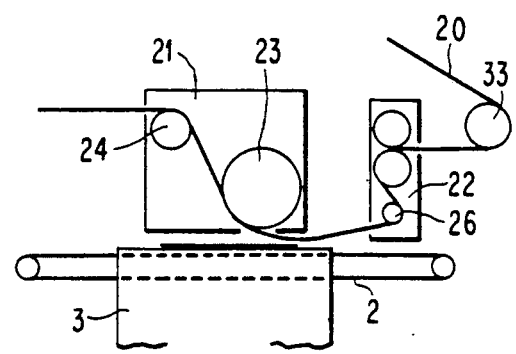
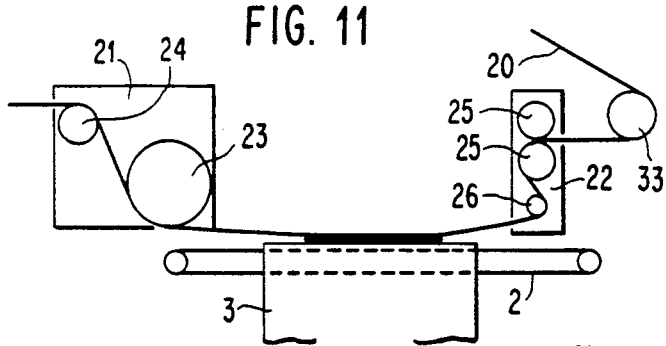
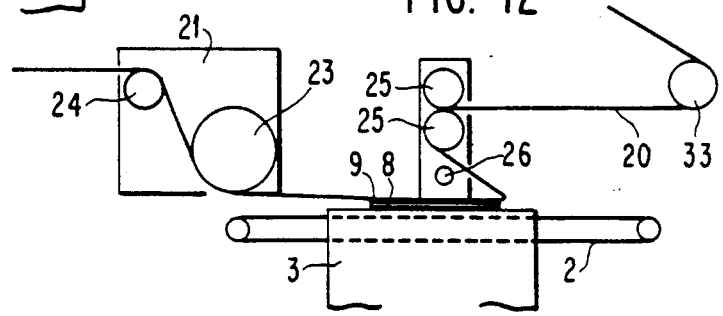
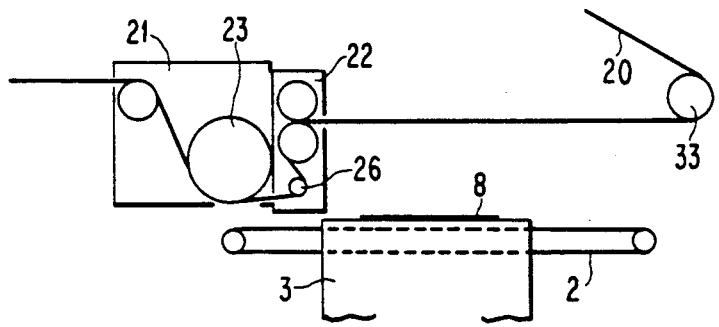
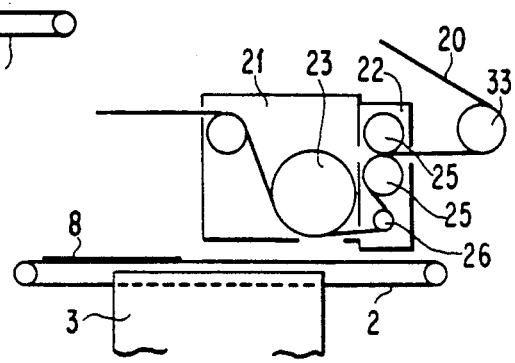

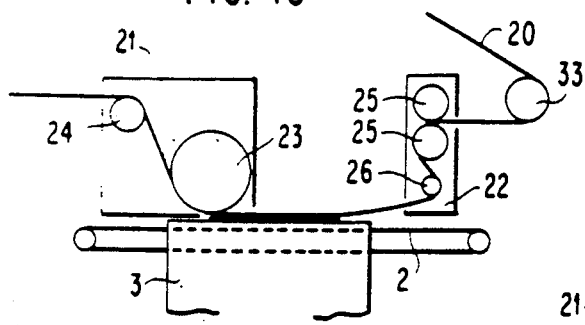
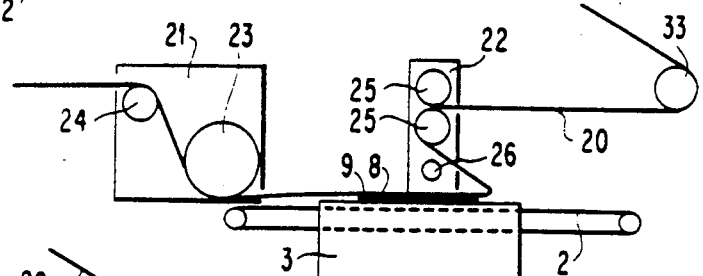
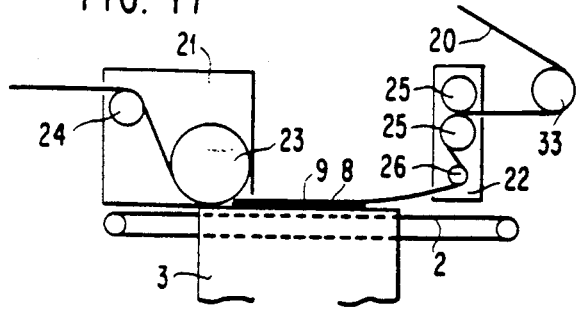
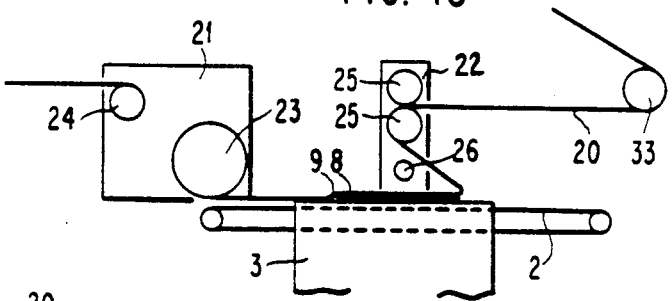
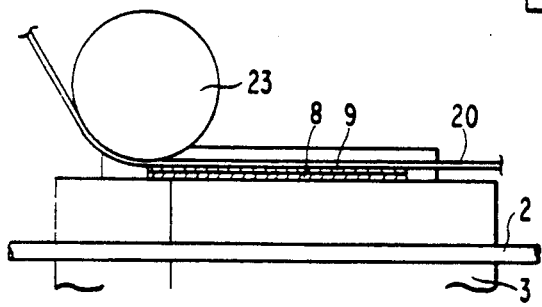
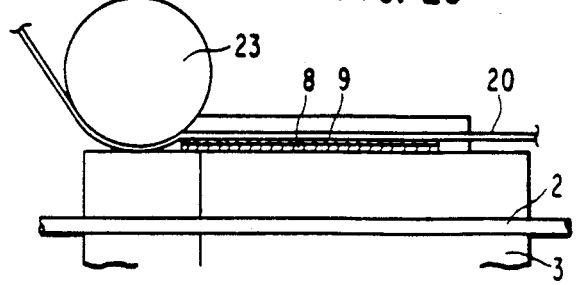

PROCESS FOR PEELING PROTECTIVE FILM OFF A WAFER

FIELD OF THE INVENTION

This invention relates to a process for automatically peeling an adhesive protective film stuck to an upper side of a wafer such as a semi-conductor wafer for integral circuits.

BACKGROUND OF THE INVENTION

In the production of wafers such as semiconductor silicon wafers for integral circuits, a protective film is stuck to one side of the wafer for protection. After the other side of the wafer has been polished by a wafer flow or processed otherwise, the protective film has to be peeled off the wafer.

Various processes for peeling the adhesive protective film stuck to the wafer by utilizing the adhesive force of an adhesive tape have been proposed as disclosed in, for example, U.S. Pat. Nos. 4,631,103 and 4,732,642. These conventional processes comprise sticking an adhesive tape for peeling over the whole length of the protective film stuck to the wafer by means of a press roller and then peeling the protective film off the wafer. However, since the press roller presses on the entire length of the wafer, the wafer is apt to be damaged. Besides, the unit for sticking the adhesive tape to the protective film on the wafer and the unit for peeling the adhesive tape together with the protective film stand in a line so that the apparatus for carrying out these processes should be made large-sized.

SUMMARY OF THE INVENTION

One object of this invention is to provide a process for peeling a protective film off a wafer without causing a wafer damage.

Another object of this invention is to provide a process for peeling a protective film off a wafer which can be carried out with a small-sized apparatus.

The present invention provides a process for peeling a protective film stuck to an upper side of a wafer, comprising feeding a wafer with a protective film stuck thereon to a table and holding the wafer in position on the table, adhering an adhesive tape to the rear end of said protective film stuck on the wafer by means of a press roller, lifting the press roller and moving said press roller forward, moving a peeling unit forward to peel the adhesive tape together with the protective film stuck thereto, and then carrying away the wafer from the table (first process).

In the above-described process of the present invention, the second process comprises adhering an adhesive tape to the rear end of the protective film on the wafer, moving a peeling unit forward while lifting the press roller and moving the same forward, thereby peeling the protective film together with the adhesive tape from the wafer, and the third process comprises adhereing an adhesive tape to the rear end of the protective film on the wafer, lifting the press roller and moving the same forward, dropping the press roller at the front side of the wafer or in the front of the wafer, and carrying away the wafer from the table after or while contacting the adhesive tape with the front end of the protective film or with the table in the front of the wafer.

BRIEF DESCRIPTION OF THE ACCOMPANYING DRAWINGS

FIGS. 9 to 14 are side views showing how the protective film is peeled off the wafer in the first process.

FIGS. 15 and 16 are side views of each step in the second process.

FIGS. 17 and 18 are side views of each step in the third process.

FIG. 19 is an enlarged side view of the main portion in FIG. 15.

FIG. 20 is an enlarged side view of the main portion in FIG. 17.

DETAILED DESCRIPTION OF THE INVENTION

Figure 1:
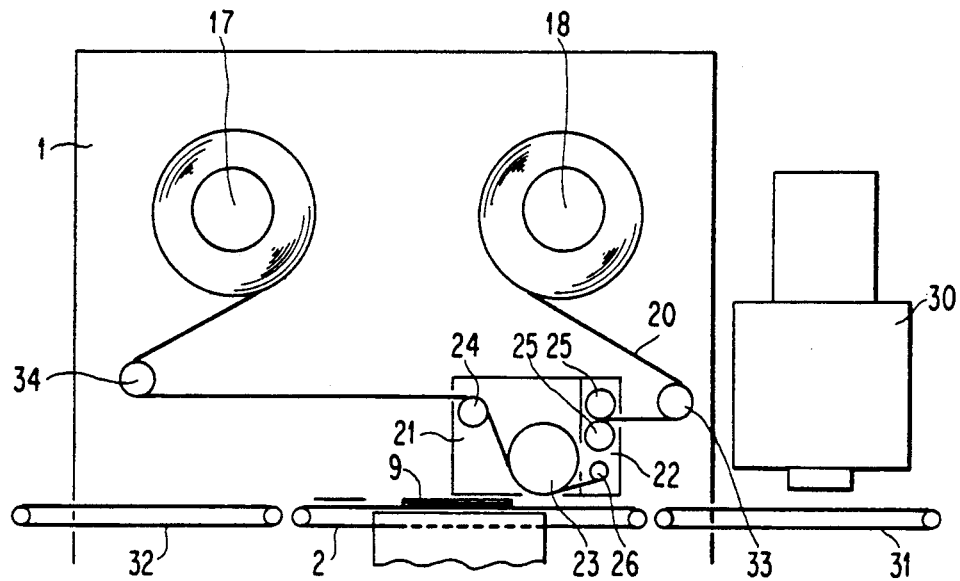
FIG. 1 is a side view of an apparatus for carrying out the process of the present invention.

Referring to FIG. 1 illustrating one embodiment of the apparatus for carrying out the process of this invention, a frame 1 has, at the lower part thereof, a pair of endless conveyer belts arranged side by side as a conveying means. The belts 2 are vertically movable in two stages and ar intermittently driven in the direction indicated by an arrow by an appropriate driving means (not shown).

Figure 2:
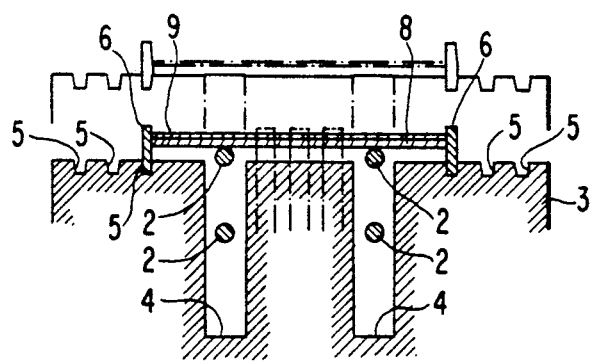
FIG. 2 is an enlarged vertically sectional view of a table on which a wafer with a protective layer is mounted.
Figure 3:
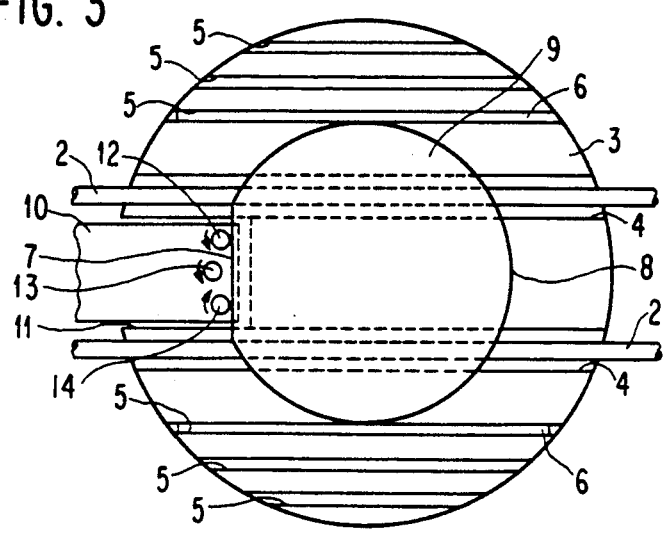
FIG. 3 is an enlarged plan view of the same.

A vacuum suction table 3 is vertically movable in two stages by a driving means. As shown in FIGS. 2 and 3, the table 3 has a pair of deep grooves 4 arranged in parallel in each of which the endless conveyer belt 2 is fitted. On the surface of the table 3 at both sides of the grooves 4, there are a plurality of guiding grooves 5 parallel with each other, in which wafer guides 6 are removably fitted for positioning the wafer 8 on the table 3 in the cross direction. A bracket 10 in a cave 11 between the pair of conveyer belts 2 and in front of the table 3 has three spindles 12, 13 and 14 for positioning the wafer on the table 3 in the machine direction. The central spindle 13 is provided slightly forward with respect to the other two spindles 12 and 14 so that the periphery of the wafer 8 evenly contacts the three spindles. Each of the spindles 12, 13 and 14 is made to rotate at the same speed in the direction of arrows in FIG. 3 by means of an endless belt (not shown).

On one side of the frame 1, a let-off spindle 17 having a brake and a take-up spindle 18 which is driven to the direction of the arrow by means of a driving apparatus are mounted. A web of an adhesive tape 20 is wound around the spindle 17 and taken out through a guide roller 34, and the adhesive tape 20 to which a protective film 9 peeled off the wafer is stuck is taken up around the take-up spindle 18 through a guide roller 33.

A pressing unit 21 comprises a press roller 23 made of a soft material such as rubber and a guide roller 24. The unit 21 is vertically movable in two stages by means of, for example, an air cylinder and can be slidably traversed by an appropriate driving means (not shown) forward (to the left-hand side of FIG. 1) and backward (to the right-hand side of FIG. 1). The press roller 23 has a width smaller than the interval of the guides 6 on the table 3.

A peeling unit 22 comprises a vertically arranged pair of rollers 25 and a peeling roller 26 below the rollers 25. The unit 22 is slidably traversed by a driving means independently of the pressing unit 21. The peeling roller 26 has a width larger than the interval of the guides 6 on the table 3.

When the protective film has an adhesive layer whose adhesive strength is initially large, but reduced due to three-dimensional network formation on irradiation of ultraviolet light, a ultraviolet light emitter 30 is provided at the rear of the frame 1.

Further, in FIG. 1, 31 is an endless conveyer belt for receiving the wafer, 32 is an endless conveyer belt for feeding the wafer, and 33, 34 are guide rollers arranged in front of the flame 1.

A process for peeling a protection film using the above-described apparatus is explained below.

The apparatus further includes, though not shown, a magazine at the right-hand side of FIG. 1, in which a lot of wafers each having a protective film and having been subjected to prescribed processings are stacked one upon another.

A wafer 8 with a protective film 9 is taken out of the above-stated magazine and fed to the conveyer belts 2 via an endless conveyer belt 31 while the spindles 17 and 18 being stopped. If desired, the wafer 8 while being carried on the belt 31 is irradiated with ultraviolet rays emitted from the ultraviolet light emitter 30.

Figure 4:
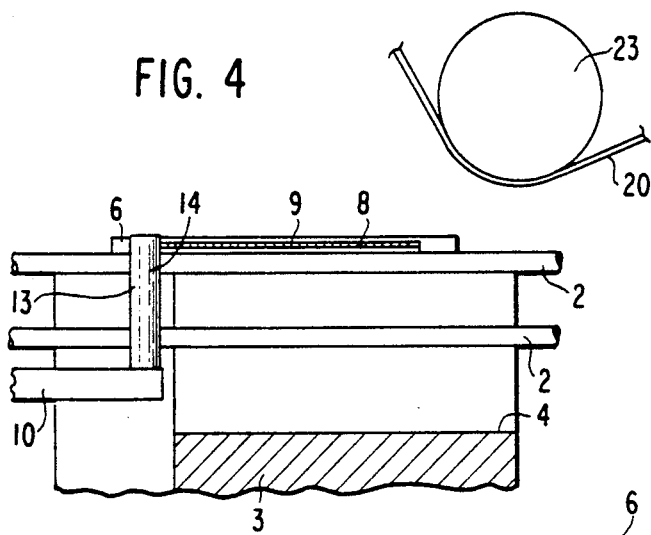
FIGS. 4 to 6 are enlarged sectional views showing positions of the table and conveyer belts.
Figure 5:
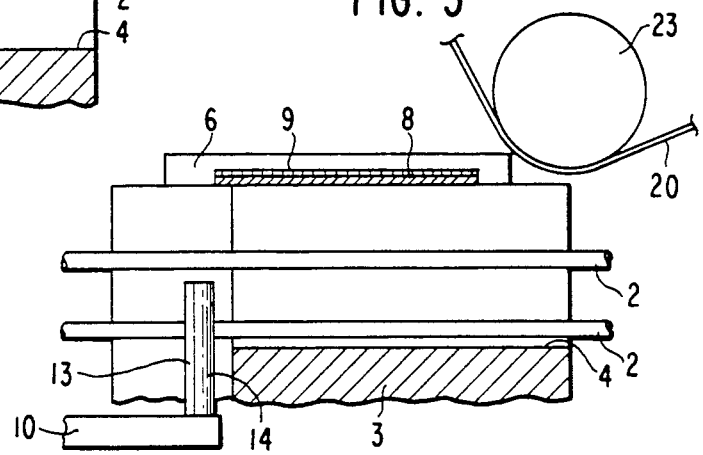

While the wafer is fed, the table 3 is held at the lower position as indicated by the solid line of FIG. 2 and shown by FIG. 4 so that the top of the belts 2 is slightly higher than the top of the table 3. Since the tops of the spindles 12, 13 and 14 for positioning project over the top of the belts 2, the wafer 8 on the belts 2 comes between the guides 6 on the table 3 as shown by the solid line of FIG. 2 and shown in FIG. 4, and stops on contact with the rotating spindles 12, 13, and 14 (FIGS. 3 and 4).

On contact with the rotating spindles, the wafer 8 is made to rotate by friction with the neighboring spindles 12 and 13 which are rotating in the same direction until an orientating flat 7, a straight line portion of the periphery of the wafer 8, comes to the spindles 12, 13 and 14, where the central spindle 13 does not touch the orientating flat while the spindles 12 and 14 which are rotating in the opposite directions touch the both ends of the orientating flat 7 to thereby stop the wafer 8 in position.

Figure 7:
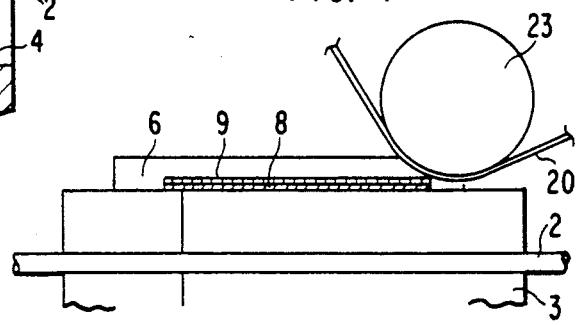
FIGS. 7 and 8 are enlarged sectional views showing positions of a press roller and an adhesive tape at the time of sticking the adhesive tape to the protective film on the wafer.

Then, the table 3 rises to the position indicated by the broken line of FIG. 2, i.e., the position shown by FIG. 7 to be higher than the top of the belts 2, whereby the thus positioned wafer 8 is transferred from the belts 2 to the table 3.

When the wafer 8 comes on the table 3, the vacuum suction means starts to work to fix the wafer 8 by suction through vacuum ports provided on the table 3, and the wafer 8 approaches the adhesive tape 20 at the lower side of the press roller 23.

The pressing unit 21 at the elevated position then starts to drop and slide forward until the adhesive tape 20 contacts the upper side of the rear end of the wafer 8 to stick the adhesive layer thereof to the rear end of the protective film 9 on the wafer 8 (FIGS. 7 and 9).

The pressing unit 21 together with the press roller 23 slightly rises above the wafer 8 and moves forward (FIGS. 8 and 10) so that the pressing of the adhesive tape 20 by the press roller 23 is relieved, and the adhesive tape 20 separates apart from the protective film 9 or sags by the weight itself to be developed on the protective film 9 in light contact (FIG. 11).

Then, the peeling unit 22 starts to move to peel the adhesive 20 together with the protective film 9 off the wafer 8 (FIGS. 12 and 13).

Figure 6:
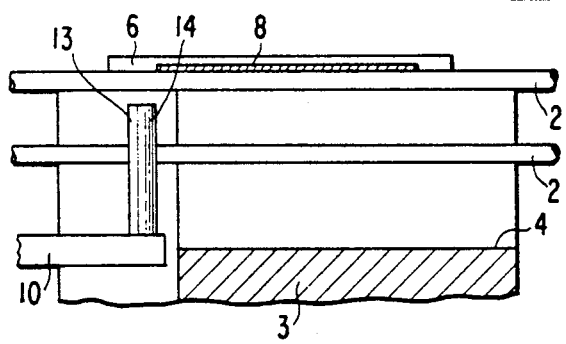

On complete peeling of the protective film 9 by the above operation, the table 3 is lowered to the position indicated by the solid line of FIG. 2 whereby the wafer 8 is supported by the belts 2 (FIGS. 2 and 6). At this time, the bracket 10 is also lowered to place the spindles 12, 13 and 14 below the belts 2.

The belts 2 are driven to carry away the wafer 8 with the protective film peeled and forward it to the magazine at the left-hand side of FIG. 1 (not shown) via the conveyer belts 32. At this time, since the press roller 23 is held above the wafer 8, the adhesive tape 20 does not contact with the wafer 8 any more.

Thereafter, the brake of the let-off spindle 17 is relieved to allow it to freely turn and the take-up spindle 18 is rotated while the pressing unit 21 and the peeling unit 22 are returned to their original positions (FIG. 14) to thereby feed and take up the adhesive tape 20.

By repeating the above-described steps, the wafers 8 are processed on after another to peel the protective film by the adhesive force of the adhesive tape 20.

In the above-described embodiment, the pressing unit 21 is passed over the wafer 8 while maintaining the pressing unit at the elevated position as shown in FIGS. 10 and 11.

In this embodiment, in some cases the tape 20 lifts from the protective film 9 on the wafer 8 at the front end portion of the wafer 8. If the protective film 9 is peeled off together with the tape 20 in such a state, in rare cases the front end of the wafer 8 lifts and the wafer 8 breaks.

In view of the above, FIGS. 15 and 19 show the embodiment that when the pressing unit 21 becomes near the front end of the wafer 8, the pressing unit 21 is dropped.

In the above embodiment, the unit 21 wherein the tape 20 is adhered on the protective film 9 at the front portion of the wafer 8 is in the dropped position as shown in FIG. 16, and moves forward while pressing the wafer 8 with the tape 20, and subsequently the peeling unit 22 moves forward to peel off the protective film 8 together with the tape 20. Therefore, the wafer does not rise.

In FIGS. 17 and 20, the pressing unit 21 is dropped at the front of the wafer 8 to adhere the tape 20 on the table 3.

Figure 8:
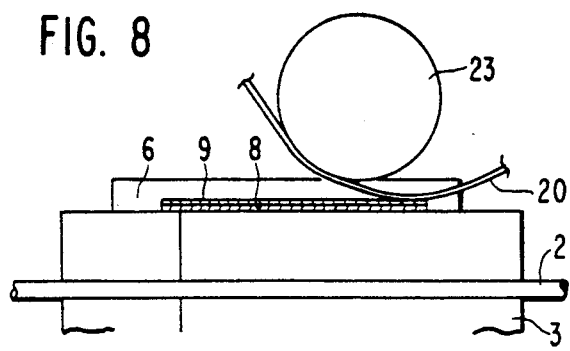

In this case, the unit 21 wherein the tape 20 is adhered on the table 3 moves forward at the dropped position as shown in FIG. 8, and subsequently the peeling unit 22 moves forward to peel off the protective film 9 together with the tape 20.

Further, the tape 20 is adhered on the table 4 at the front portion of the wafer 8 to fix the wafer 8 on the table 3. Therefore, the wafer does not rise in peeling off the film 9.

In each of the embodiments described above, after the tape 20 is adhered over the protective film 9 on the wafer 8, the peeling unit begins to move forward. However, a process wherein the peeling unit 22 begins to move forward while the press unit 21 moves forward to adhere the tape 20 on the protective film, can also be employed.

Further, in each of the embodiments described above, the starting position is such that the pressing unit 21 and the peeling unit 22 are set at the right-hand side of FIG. 1. However, it is also possible that the state that the pressing unit 21 and the peeling unit 22 are positioned at the left-hand side as shown in FIG. 13 is the waiting position, the wafer 8 before peeling off the protective film is supplied from the right-hand side under the above state, and the series of the steps is then carried out.

While in the above-described embodiment, the wafer is positioned after it is mounted on the table, the wafer may be positioned by a positioning means provided in front of the table and then mounted on the table. In some cases, the positioning of the wafer is not done.

As described above, since the adhesive tape is pressed by a press roller onto the small portion of the rear end of the wafer having a protective film, and after or while the press roller is lifted and moved forward, the protective film is peeled off together with the adhesive tape, there is no fear that the wafer is damaged as is encountered in the conventional processes in which the adhesive tape is adhered to the entire length of the wafer.

Further, the adhesive tape is adhered on a slight portion of the rear portion of the wafer, the pressing roller is lifted and moved forward, and the pressing roller is dropped in the vicinity of the front portion of the wafer to again adhere the adhesive tape on the table at the front end portion of the wafer or in the front of the wafer. Therefore, in a process for peeling the protective film together with the adhesive tape while pressing the front portion of the wafer with the adhesive tape, breakage by the rising of the wafer at the final stage of the peeling step can be prevented, and as a result, breakage preventing effect is further increased.

In addition, since the pressing unit and the peeling unit move to the same direction with a some time-lag to effect adhesion and peeling of the adhesive tape on the same level, the apparatus for carrying out the process can be reduced in size.

While the invention has been described in detail and with reference to specific embodiments thereof, it will be apparent to one skilled in the art that various changes and modifications can be made therein without departing from the spirit and scope thereof.

What is claimed is:

1. A process for peeling a protective film stuck to an upper side of a wafer, comprising feeding a wafer with a protective film stuck thereon to a table and holding the wafer in position on the table, adhering an adhesive tape to an upper side of a rear end of said protective film stuck on the wafer by means of a press roller, lifting the press roller, so that the press roller no longer presses against said protective film, and moving said press roller forward, moving a peeling unit forward to peel the adhesive tape together with the protective film stuck thereto, and then carrying away the wafer form the table.

2. A process as claimed in claim 1, wherein the wafer is fixed on the table, the adhesive tape is adhered on said rear end of the protective film on the wafer with the press roller, and said peeling unit is moved forward while lifting the press roller and moving the same forward, thereby peeling the protective film together with the adhesive tape from the wafer.

3. A process as claimed in claim 1 or 2, wherein the wafer is fixed on the table, the adhesive tape is adhered on the rear end of the protective film on the wafer with the press roller, the press roller is lifted and moved forward, and the press roller is dropped at the front side of the wafer to contact the adhesive tape with a front end of the protective film.

4. A process as claimed in claim 1 or 2, wherein the wafer is fixed on the table, the adhesive tape is adhered on the rear end of the protective film on the wafer with the press roller, the press roller is lifted and moved forward, and the press roller is dropped in a front area of the wafer to contact the adhesive tape with the table in the front of the wafer.

5. A process as claimed in claims 1 or 2, wherein the step of adhering an adhesive tape to an upper side of a rear end of said protective film stuck on the wafer by mans of a press roller is repeated to strongly adhere the adhesive tape to the upper side of the rear end of the protective film.

6. A process as claimed in claim 3, wherein the step of adhering an adhesive tape to an upper side of a rear end of said protective film stuck on the wafer by means of a press roller is repeated to strongly adhere the adhesive tape to the upper side of the rear end of the protective film.

7. A process as claimed in claim 4, wherein the step of adhering an adhesive tape to an upper side of a rear end of said protective film stuck on the wafer by means of a press roller is repeated to strongly adhere the adhesive tape to the upper side of the rear end of the protective film.

* * * * *